United States Patent [19]

Ha et al.

[11] Patent Number: 5,136,188

[45] Date of Patent: Aug. 4, 1992

[54] INPUT/OUTPUT MACROCELL FOR PROGRAMMABLE LOGIC DEVICE

[75] Inventors: Chang W. Ha, Keumjeongku; Joong K. Moon, Songpaku, both of Rep. of Korea

[73] Assignee: Hyundai Electronics Industries Co., Ltd., Kyoungkido, Rep. of Korea

[21] Appl. No.: 742,605

[22] Filed: Aug. 8, 1991

[30] Foreign Application Priority Data

Aug. 9, 1990 [KR] Rep. of Korea ............... 1990-12258

[51] Int. Cl.[5] ................. G06F 7/00; H03K 19/173; H03K 19/20
[52] U.S. Cl. ................. 307/465; 307/241; 328/104; 328/154; 365/189.08
[58] Field of Search ................. 307/241, 243, 465; 328/103, 104, 154; 365/189.08

[56] References Cited

U.S. PATENT DOCUMENTS

| | | | |
|---|---|---|---|
| 4,593,390 | 6/1986 | Hildebrand et al. | 307/243 X |
| 4,609,986 | 9/1986 | Hartmann et al. | 395/800 |
| 4,617,479 | 10/1986 | Hartmann et al. | 307/468 X |
| 4,845,496 | 7/1989 | Dower et al. | 341/13 |
| 4,878,200 | 10/1989 | Asghar et al. | 365/189.02 |
| 4,983,959 | 1/1991 | Breuninger | 307/465 X |
| 5,053,647 | 10/1991 | Shizukuishi et al. | 307/465 |
| 5,055,712 | 10/1991 | Hawley et al. | 307/465 |

Primary Examiner—Eugene R. Laroche
Assistant Examiner—Do Hyum Yoo
Attorney, Agent, or Firm—Darby & Darby

[57] ABSTRACT

In a programmable logic device having a programmable logic array 15 adapted to receive a plurality of input signals and provide a plurality of output signals (product terms) through an AND logic which depend on the input signals and information stored in the logic array and a macrocell associated with the logic array, the macrocell including a first OR gate group 11 including a plurality of OR gates, each for ORing the predetermined number of the product terms from the logic array; a demultiplexor group 12 including a plurality of demultiplexors each coupled to output of the corresponding OR gate in the first OR gate group 11, each for generating two or more output signals per one input signal; a second OR gate group 13 including a plurality of OR gates each coupled to a corresponding one of outputs of each of the plurality of demultiplexors, each for ORing the corresponding outputs from the plurality of demultiplexors to form a sum data path for the product terms; and an input/output circuit 14 for receiving data from the plurality of sum data paths for the product terms provided by the plurality of OR gates in the second OR gate group 13 to transfer the received data to an output stage or feedback that to the logic array; whereby the plurality of sum data paths for the product terms are provided in one macrocell.

9 Claims, 3 Drawing Sheets

INPUT/OUTPUT MACROCELL FOR PROGRAMMABLE LOGIC DEVICE

BACKGROUND OF THE INVENTION

1. Field of the Invention

The present invention relates in general to integrated circuits of the type called programmable logic devices, and more particularly to a macrocell associated with a programmable memory array provided with an EPROM transistor or an EEPROM transistor.

2. Description of the Prior Art

For implementing logic functions, there have broadly been used a type of integrated circuits known as erasable and programmable logic devices (EPLDs) or electrically erasable and electrically programmable logic devices (EEPLDs).

Such EPLD structures are at the beginning shown in U.S. Pat. Nos. 4,609,986 and 4,617,749. In logic devices as disclosed in the above patents, there is provided an AND array configured to form a plurality of "product terms" which are fed into an OR array, the outputs of which form sum-of-products expressions of the inputs to the AND array. The ORing of product terms is each either coupled to an output pin through an input/output (I/O) circuit in each of a plurality of macrocells, or fed back to the AND array, so that each macrocell is capable of performing various combinatorial logics or sequential logics. The macrocells shown in the above patents each receives the predetermined number of product terms from the AND array and ORs the received product terms. The ORing of product terms is each received to the input/output (I/O) circuit in each of the macrocells. The adjacent macrocells are independent of each other.

However, in such structures shown in the above patents, because the product terms fixed in number or ORed, the product terms are wasted in the case where a logic is embodied which requires product terms smaller in number than the product terms previously fixed in number, and another macrocell should be added for use in the case where a logic is embodied which requires product terms larger in number than the product terms previously fixed in number. As a result, an efficiency of the macrocell is degraded in use. Also in such structures, there is present one ORed path, i.e., one sum data path for product terms per macrocell, making it impossible to use a register in the macrocell when a system user tries to embody a combinatorial logic in the designated macrocell. More particularly, the register is limited in number to that identical to the macrocell, thereby causing a degradation in an efficiency of the register in use.

U.S. Pat. No. 4,878,200 shows a method of allowing product term sharing/allocation by adjacent macrocells for the efficient use of product term. In such structure in the above U.S. Pat. No. 4,878,200, two groups of four product terms each are coupled to each macrocell, wherein the ORing of each group of four product terms is each coupled to a multiplexor. One group is also coupled to a previously adjacent macrocell and the second group is coupled to a subsequently adjacent macrocell. As a result, the macrocell requiring larger product terms in number can share product terms with the adjacent macrocell, and the macrocell requiring smaller product terms in number can allocate product terms to the adjacent macrocell. However, also in such structures, there is present one ORed path, i.e., one sum data path for product terms per macrocell, causing the above-mentioned problem as shown in the above U.S. Pat. Nos. 4,609,986 and 4,617,479.

In result, there is a necessity for using the function of the macrocell efficiently, with the product term.

SUMMARY OF THE INVENTION

Therefore, it is an object of the present invention to provide a macrocell including a multiplicity of sum data paths for product terms per one for an increase in an efficiency of the macrocell and product term in use.

In accordance with the present invention, the object can be accomplished by a provision of a programmable logic device having a programmable logic array adapted to receive a plurality of input signals and provide a plurality of output signals (product terms) through an AND logic which depend on said input signals and information stored in said logic array and a macrocell associated with said logic array, said macrocell comprising: first ORing means including a plurality of OR gates, each for ORing a predetermined number of said product terms from said logic array; demultiplexing means including a plurality of demultiplexors each coupled to output of the corresponding OR gate in said first ORing means, each for generating two or more output signals per one input signal; second ORing means including a plurality of OR gates each coupled to a corresponding one of outputs of each of said plurality of demultiplexors in said demultiplexing means, each for ORing said corresponding output from said plurality of demultiplexsors in said demultiplexing means to form a sum data path for said product terms; and input/output means for receiving data from said plurality of sum data paths for said product terms provided by said plurality of OR gates in said second ORing means to transfer the received data to an output stage or feedback that to said logic array; whereby said plurality of sum data paths for said product terms are provided in one macrocell.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF PREFERRED EMBODIMENTS

Figure 1:
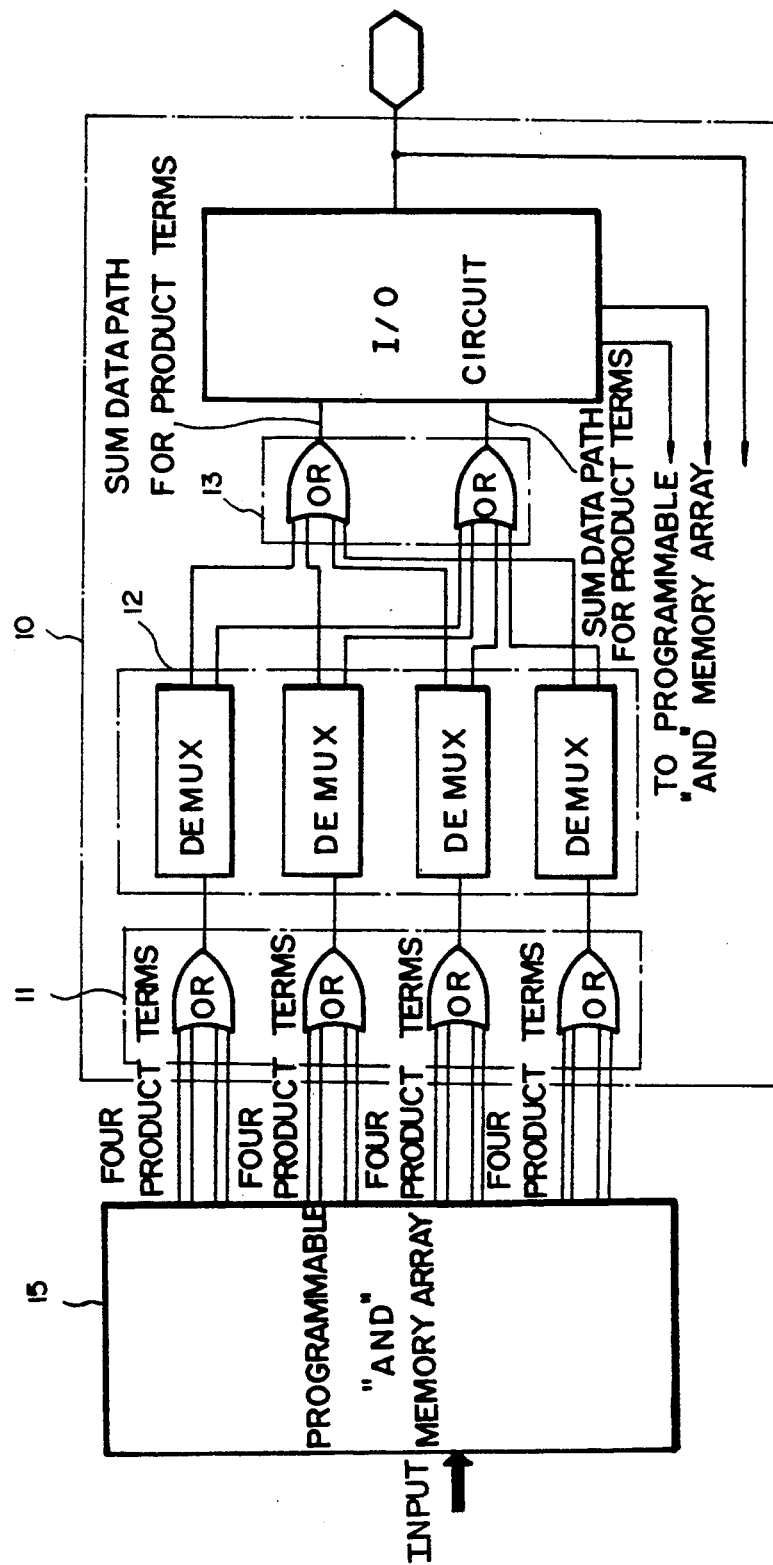
FIG. 1 is a logic block diagram of an embodiment of a programmable logic device of the present invention.

With reference to FIG. 1, there is shown a logic block diagram of an embodiment of a programmable logic device of the present invention. The programmable logic device includes an erasable and programmable EPROM "AND" memory array 15 and a macrocell 10. The AND array 15 receives a plurality of inputs and outputs 16 product terms to the macrocell 10. Four groups of four product terms each are ORed in the macrocell 10. The macrocell 10 comprises a first and a second OR gate groups 11 and 13 a demultiplexor group 12 and an input/output (I/O) circuit 14. For the purpose of producing control signals to the macrocell, another product terms (not shown) are utilized. Four groups of signal ORed through the first OR gate group 11 including four OR gates are applied to the demultiplexor group 12 including four demultiplexors, wherein the ORing of each group of four product terms is each coupled to a demultiplexor in the demultiplexor group 12. The ORed signals inputted to the demultiplexor group 12 each is coupled selectively to two outputs of each demultiplexor in the demultiplexor group 12 by control signals from EPROM transistors. Connected to ground VSS is one not coupled to the ORed-inputted signal, of the two outputs of each demultiplexor in the demultiplexor group 12, as shown in FIG. 3.

Figure 3:
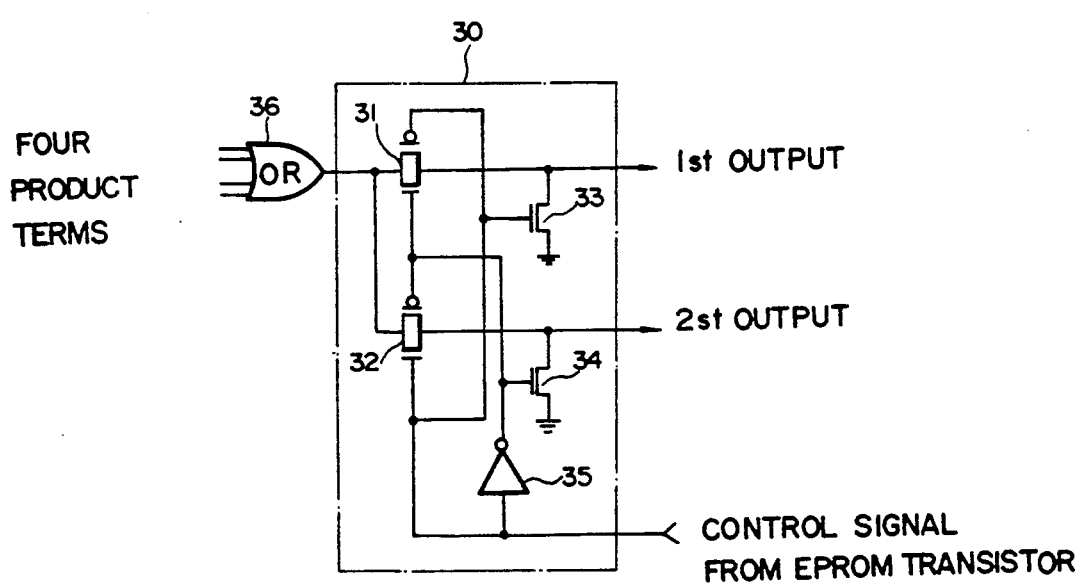
FIG. 3 is a diagram illustrating a constitution of a demultiplexor in the macrocell of FIG. 2.

With reference to FIG. 3, a demultiplexor 30 in the demultiplexor group 12 is constructed utilizing transmission gates 31 and 32. Also, the demultiplexor 30 is provided with MOSFETs 33 and 34 and an inverter 35. The reference numeral 36 designates an OR gate in the first OR gate group 11.

Turning again to FIG. 1, the demultiplexor group 12 provides eight output signal lines to the second OR gate group 13 including two OR gates. The first OR gate in the second OR gate group 13 selects and ORs the total four output signal lines, one or two lines from each of the demultiplexors in the demultiplextor group 12, so as to form a first sum data path for product terms. The second OR gate in the second OR gate group 13 ORs the total four output signal lines, the other of two lines from each of the demultiplexors in the demultiplexor group 12, being not selected by the fist OR gate, so as to form a second sum data path for product terms. The two sum data paths correspond respectively to product terms, 0, 4, 8, 12 or 16, and 16, 12, 8, 4 or 0 in number. The two sum data paths are coupled to the input/output circuit 14 for performing of a combinatorial logic or a subsequential logic.

Figure 2:
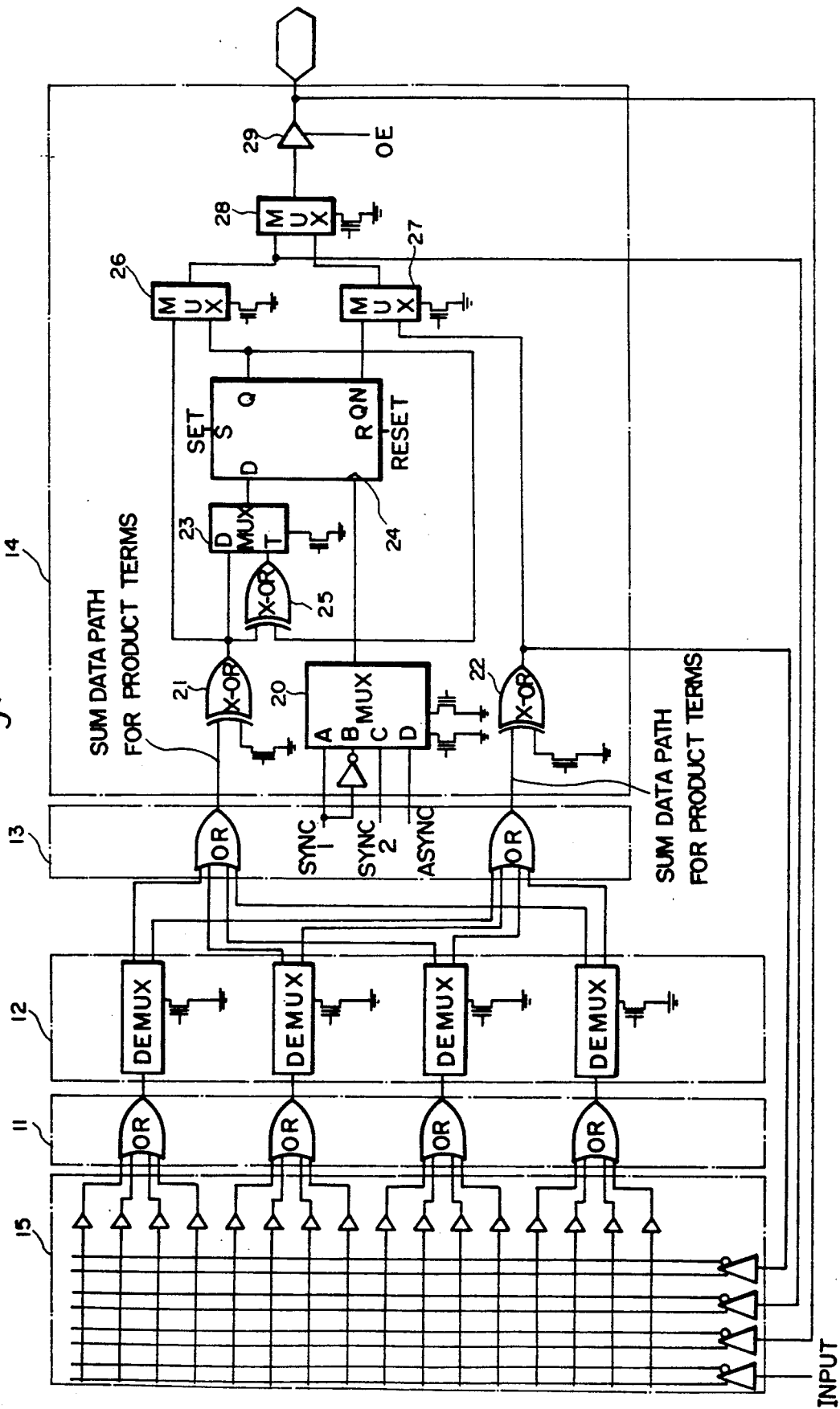
FIG. 2 is a detailed logic circuit diagram of a macrocell in the programmable logic device of FIG. 1.

With reference to FIG. 2, there is shown a detailed logic circuit diagram of the macrocell 10 in the programmable logic device shown in FIG. 1, wherein elements similar to those in FIG. 1 are designated by the same reference numerals.

The input/output circuit 14 in the macrocell 10 includes exclusive OR (XOR) gates 21 and 22 for receiving the sum data paths from the second OR gate group 13 respectively, the gates 21 and 22 being each controlled by an EPROM transistor. From the XOR gates 21 and 22 data are transferred naturally or inverted in accordance with states of the EPROM transistors. Output form the XOR gate 21 corresponding to the first sum data path for product terms is inputted to a first multiplexor (hereinafter referred to as MUX) 23 which selects a function of a flip-flop 24, and also inputted to a second MUX 26 together with output Q of the flip-flop 24. Output from the second MUX 26 is inputted to a fourth MUX 28 together with output from a third MUX 27 which inputs output from the second XOR 22, and at the same time fed back to the AND memory array 15. Output from the fourth MUX 28 is inputted to an output enable buffer 29, which then transfers the output from the fourth MUX 28 to an I/O pin in response to an output enable signal OE.

The I/O pin is coupled as input to the AND memory array 15. A fifth MUX 20 selects a clock signal to the flip-flop 24. Namely, the fifth MUX 20 selects one from synchronous clock 1, inverted synchronous clock 1, synchronous clock 2 and asynchronous clock to provide the selected one as a clock signal to the flip-flop 24. The first, second, third and fourth MUXs 23, 26, 27 and 28 each is controlled by one EPROM transistor; the fifth MUX 20 is controlled by two EPROM transistors.

Also, when data via the XOR gate 21 along the first sum data path for product terms is inputted to input D of the first MUX 23, the first MUX 23 couples the input data to input D of the flip-flop 24, so that the flip-flop 24 can function as a D flip-flop. On the other hand, when data via the XOR gate 21 along the first sum data path for product terms and output Q of the flip-flop 24 are inputted to a XOR gate 25 and then output from the XOR gate 25 is inputted to T input of the first MUX 23, which coupled the input data to input D of the flip-flop 24, so that the flip-flop 24 can function as a T flip-flop.

The D flip-flop has a set terminal and a reset terminal, each for receiving a set signal and a reset signal, being produced by another product terms from the AND array 15. Similarly, the output enable signal OE and the asynchronous signal ASYNC are produced by another product terms from the AND array 15. The AND memory array 15 has a plurality of inputs which includes a system input, a feedback signal input from the macrocell, and true data and inverted data inputs from the I/O pin. FIGS. 1 and 2 illustrate macrocell which constitutes a part of a programmable logic device. The programmable logic device contains a plurality of macrocells, a plurality of I/O pins equal in number to said macrocells, and a plurality of programmable AND memory arrays 15 associated with said macrocells.

As apparent from the above description, in accordance with the present invention, the product terms from the memory array can be used efficiently. In addition, the combinatorial and sequential logic operations can be emulated simultaneously in possession of different ones of said sum data paths for said product terms.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. In a programmable logic device having a programmable logic array adapted to receive a plurality of input signals and to provide a plurality of product terms as output signals through an AND logic which depend on said input signals and information stored in said logic array and a macrocell associated with said logic array, said macrocell comprising:

first ORing means including a plurality of OR gates, each for ORing a predetermined number of said product terms from said logic array;

demultiplexing means including a plurality of demultiplexors each coupled to output of the corresponding OR gate in said first ORing means, each for generating two or more output signals per one input signal;

second ORing means including a plurality of OR gates each coupled to a corresponding one of outputs of each of said plurality of demultiplexors in said demultiplexing means, each for ORing said corresponding outputs from said plurality of demultiplexors in said demultiplexing means to form a sum data path from said product terms; and input/output means for receiving data from said plurality of sum data paths for said product terms provided by said plurality of OR gates in said second ORing means to transfer the received data to an output stage or feedback that to said logic array;

whereby said plurality of sum data paths for said product terms are provided in one macrocell.

2. The macrocell as set forth in claim 1, wherein each of said plurality of OR gates in said first ORing means ORs a selectable number of said product terms from said logic array.

3. The macrocell as set forth in claim 1, wherein said plurality of demultiplexors in said demultiplexing means are equal in number to said plurality of OR gates in said first ORing means.

4. The macrocell as set forth in claim 3, wherein said demultiplexors in said demultiplexing means are controlled by additional product terms from said programmable logic array.

5. The macrocell as set forth in claim 3, wherein said programmable logic array includes an EPROM transistor for providing said plurality of product terms being inputted to said first ORing means.

6. The macrocell as set forth in claim 3, wherein said programmable logic array includes an EEPROM transistor for providing said plurality of product terms being inputted to said first ORing means.

7. The macrocell as set forth in claim 3, wherein said plurality of OR gates in said second ORing means are equal in number to said output signals from each of said plurality of demultiplexors in said demultiplexing means.

8. The macrocell as set forth in claim 1, wherein said input/output means is capable of emulating combinatorial and sequential logic operations simultaneously.

9. The macrocell as set forth in claim 8, wherein said combinatorial and sequential logic operations are emulated simultaneously in different ones of said sum data paths for said product terms.

* * * * *